US008233700B2

(12) United States Patent
Mamiya

(10) Patent No.: US 8,233,700 B2
(45) Date of Patent: Jul. 31, 2012

(54) SOLDER PRINTING INSPECTION APPARATUS AND COMPONENT MOUNTING SYSTEM

(75) Inventor: Takahiro Mamiya, Aichi (JP)

(73) Assignee: CKD Corporation, Komaki-shi (JP)

( * ) Notice: Subject to any disclaimer, the term of this patent is extended or adjusted under 35 U.S.C. 154(b) by 407 days.

(21) Appl. No.: 12/368,849

(22) Filed: Feb. 10, 2009

(65) Prior Publication Data

US 2009/0202143 A1   Aug. 13, 2009

(30) Foreign Application Priority Data

Feb. 13, 2008   (JP) ................................. 2008-031248

(51) Int. Cl.
*G06K 9/00* (2006.01)
(52) U.S. Cl. ........................................................ 382/151
(58) Field of Classification Search ........... 382/149–151
See application file for complete search history.

(56) References Cited

U.S. PATENT DOCUMENTS 5,621,811 A * 4/1997 Roder et al. .................. 382/147

FOREIGN PATENT DOCUMENTS

| JP | 11-218499 A | 8/1999 |
| JP | 2002-084097 A | 3/2002 |
| JP | 2006-237236 A | 9/2006 |

OTHER PUBLICATIONS

Notification of Reasons for Refusal for Japanese Application No. 2008-031248 mailed on Mar. 9, 2010 and English translation thereof, 4 pages.

* cited by examiner

*Primary Examiner* — Tarifur Chowdhury
*Assistant Examiner* — Jonathon Cook
(74) *Attorney, Agent, or Firm* — Osha Liang LLP

(57) ABSTRACT

A component mounting system includes a solder printing inspection apparatus and a component mounting apparatus. The solder printing inspection apparatus includes an ideal solder position generation unit, an ideal loading position generation unit, an image processing unit, and an ideal solder inspection standard generation unit. The ideal solder position generation unit generates ideal solder position information, and the ideal loading position generation unit generates ideal loading position information. The image processing unit generates actual solder position information and loading estimate position information. The ideal solder inspection standard generation unit generates ideal solder inspection position information. A calculation apparatus inspects a solder included in a solder group based on actual inspection standard information obtained by shifting of the ideal solder inspection standard information by just the actual position adjustment information, and the calculation apparatus outputs mounting position adjustment information to the component mounting apparatus.

20 Claims, 9 Drawing Sheets

[Figure 1]
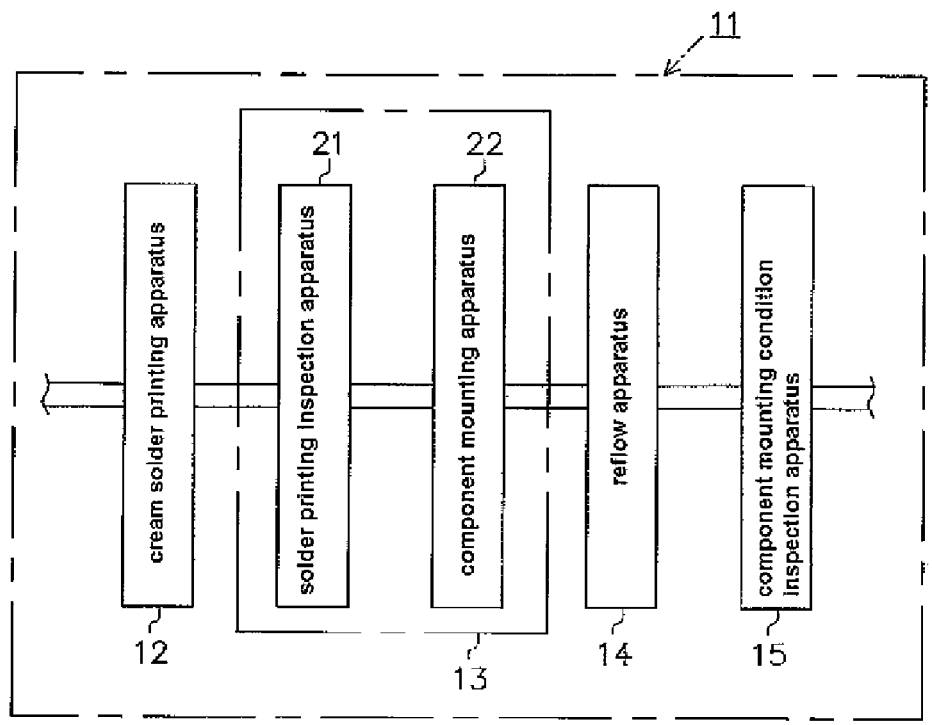
[Figure 2]
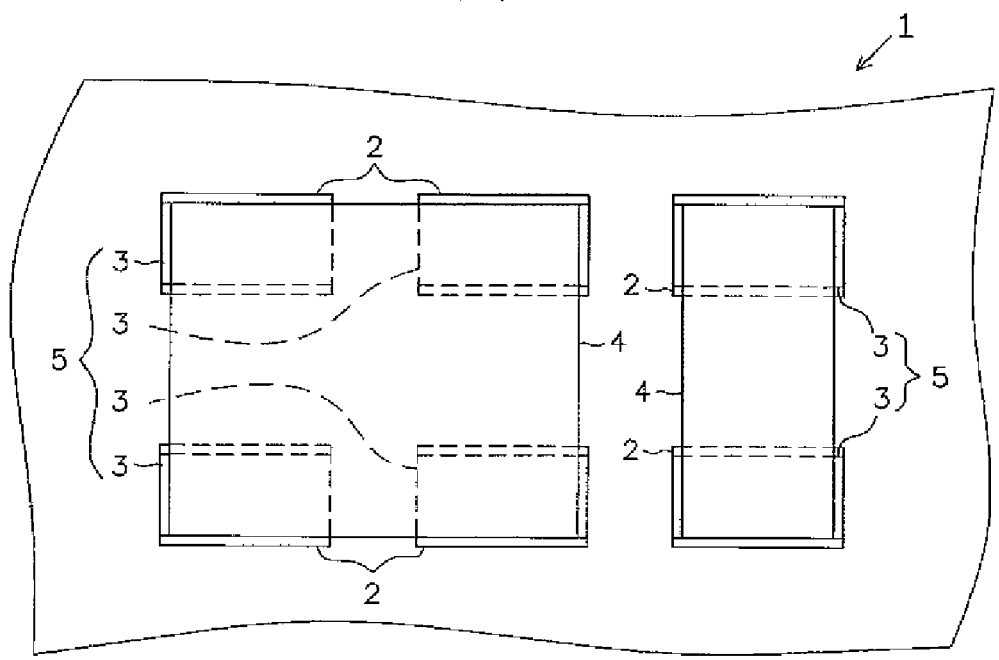

[Figure 3]
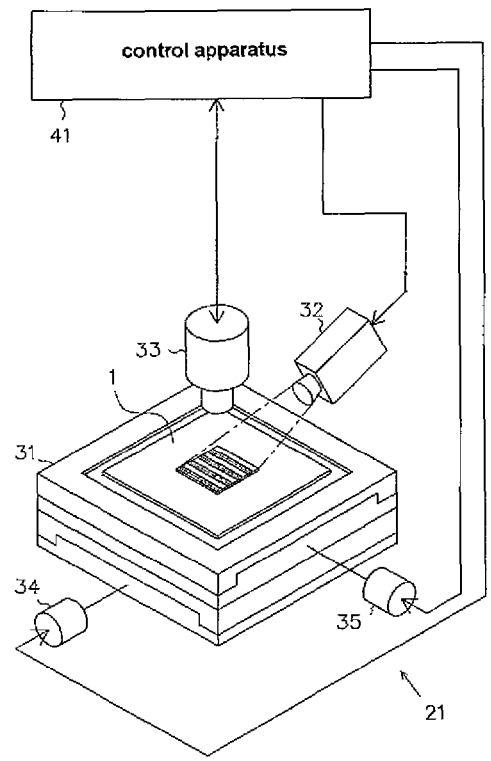
[Figure 4]
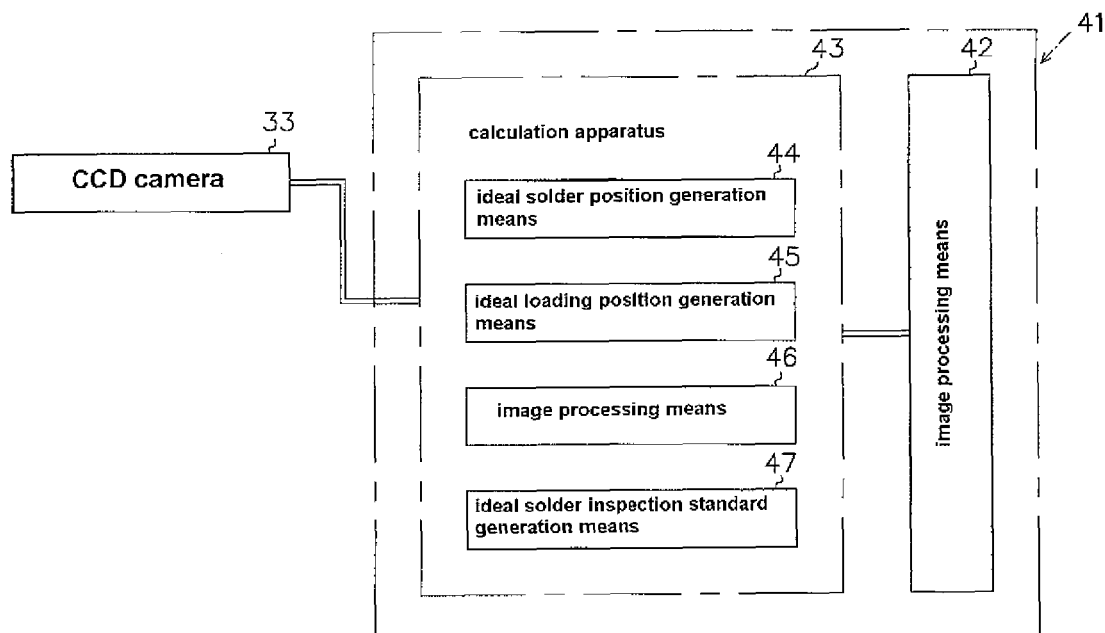

[Figure 5]
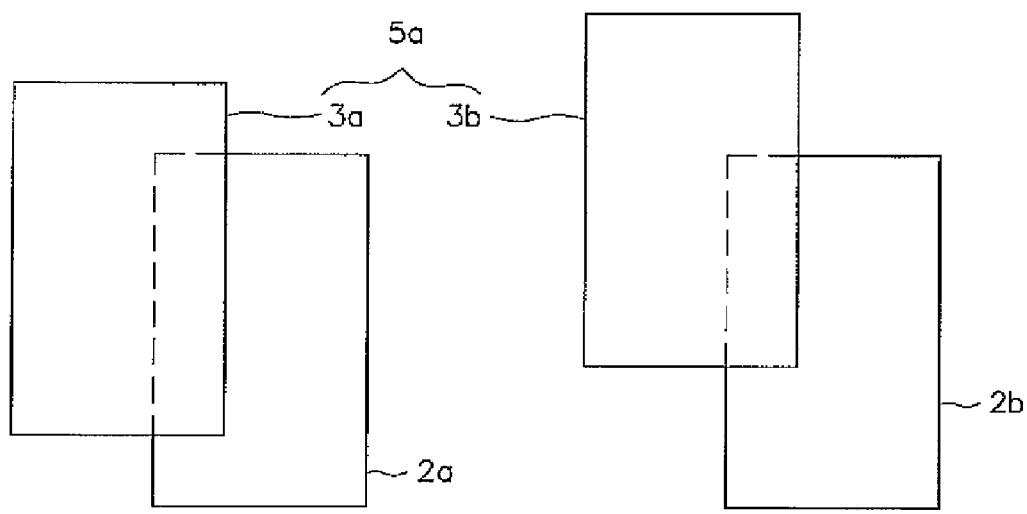
[Figure 6]
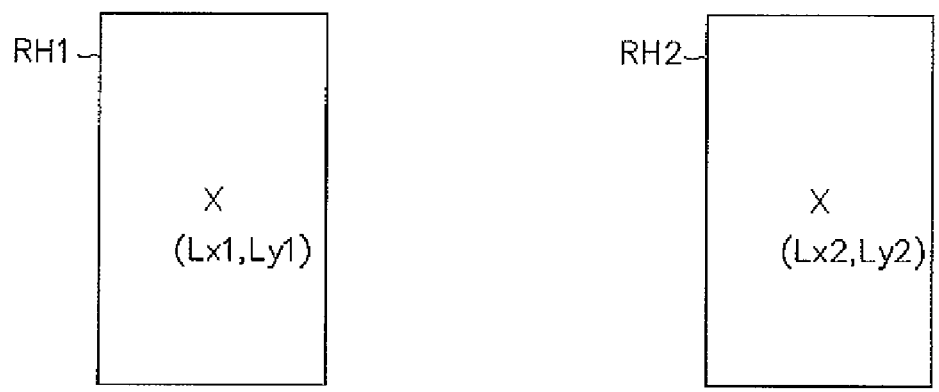
[Figure 7]
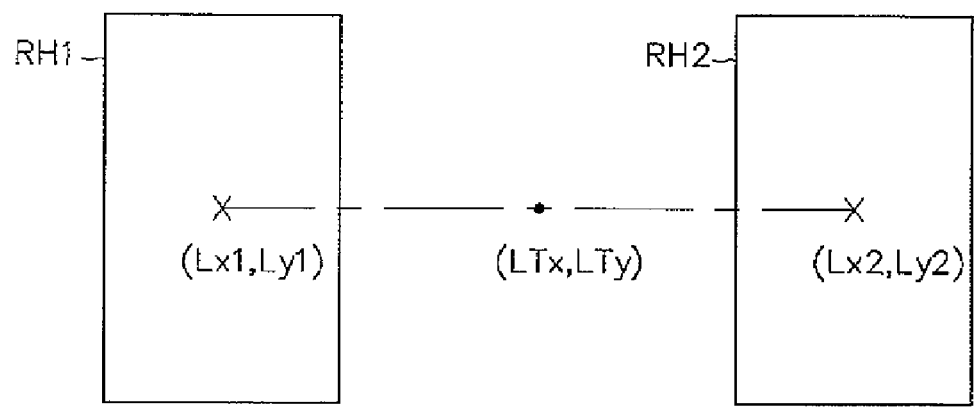

[Figure 8]
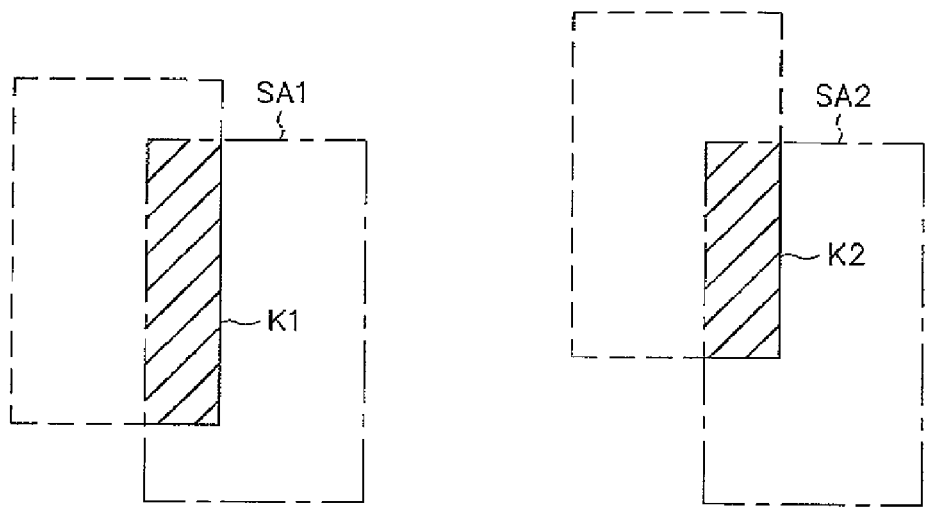
[Figure 9]
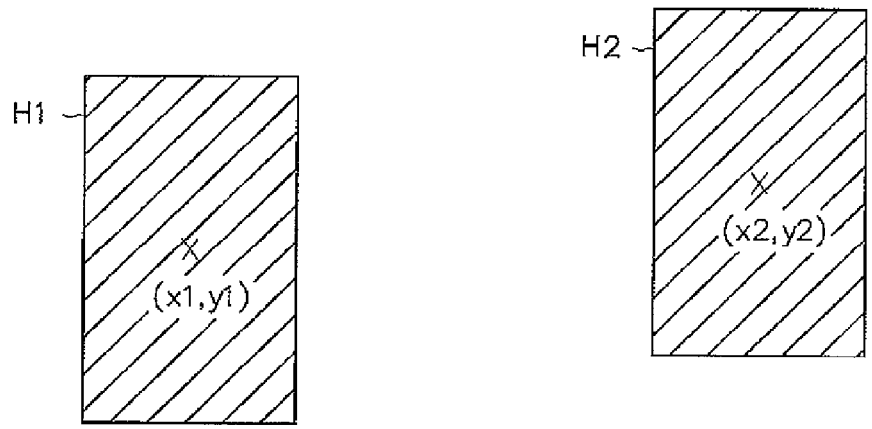
[Figure 10]
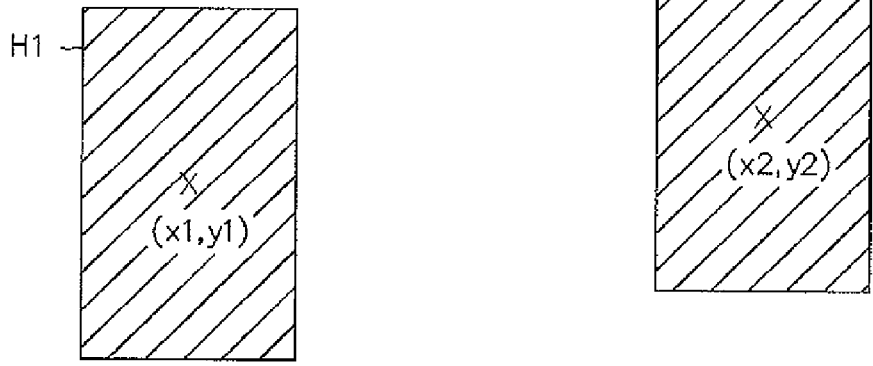

[Figure 11]
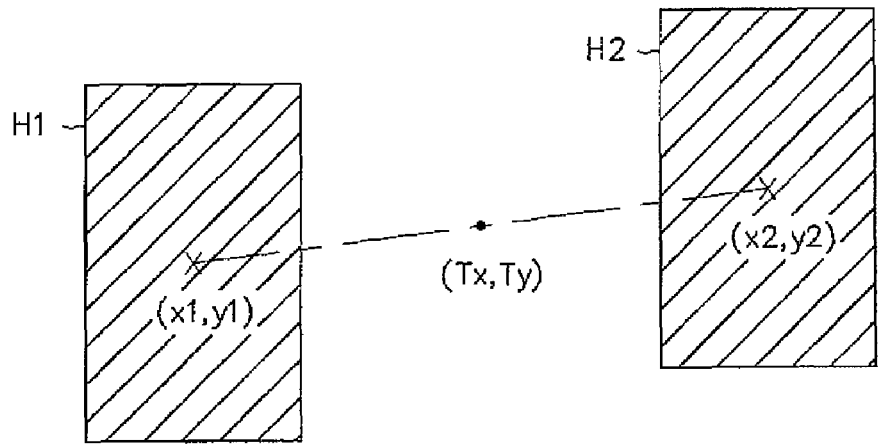
[Figure 12]
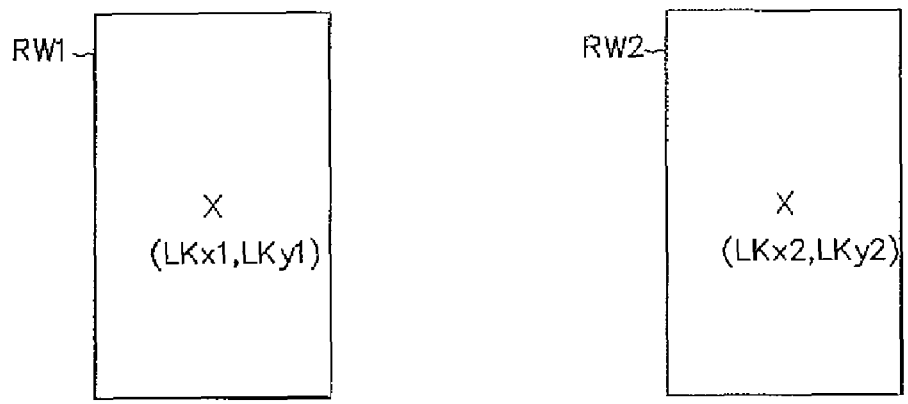
[Figure 13]
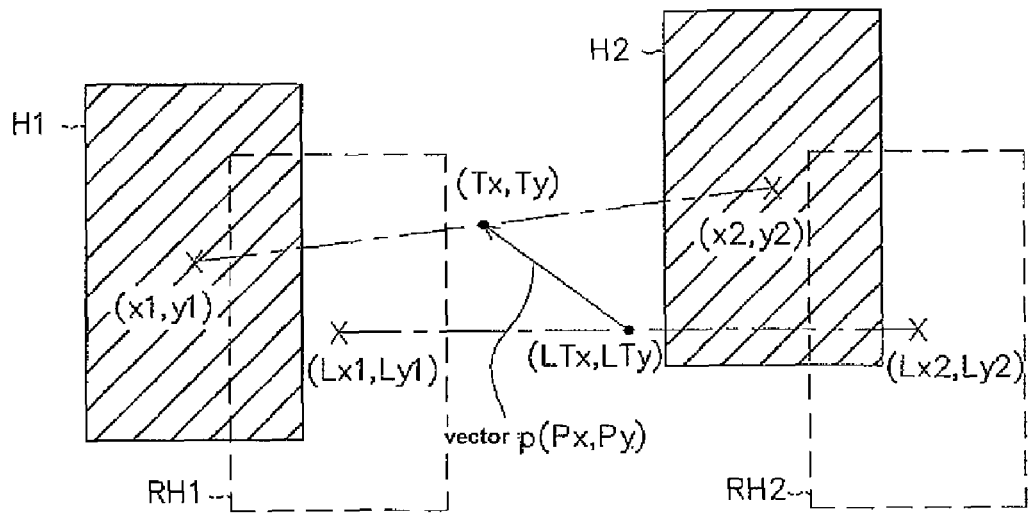

[Figure 14]
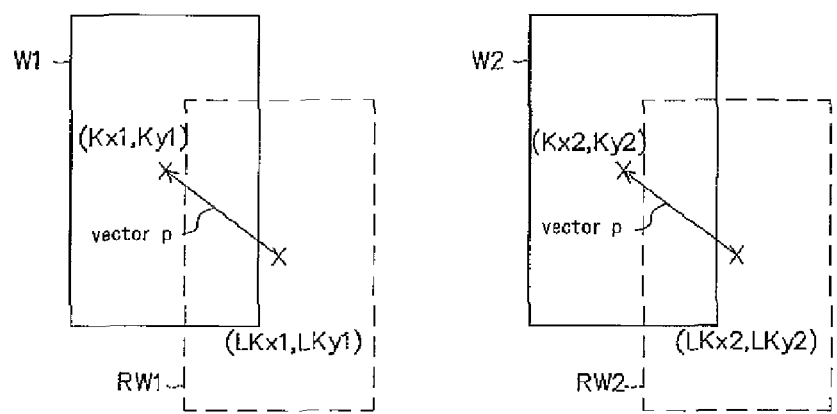
[Figure 15]
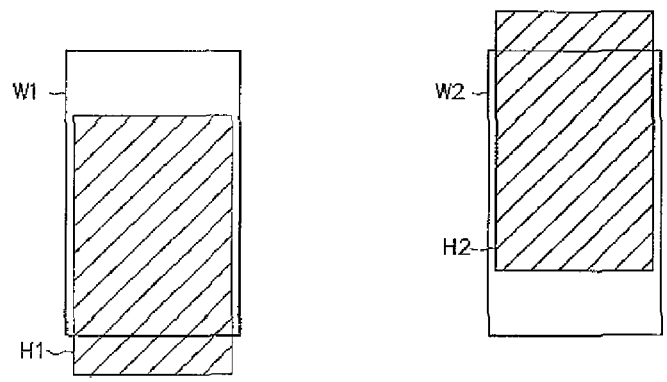
[Figure 16]
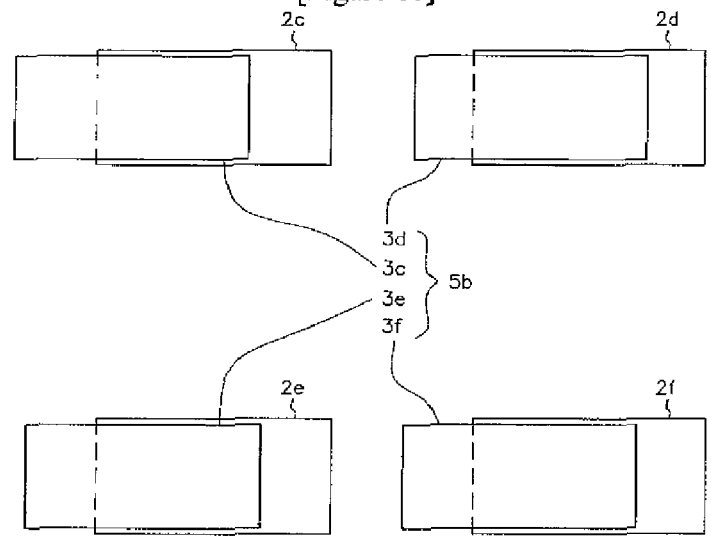

[Figure 17]
[Figure 18]
[Figure 19]

[Figure 20]
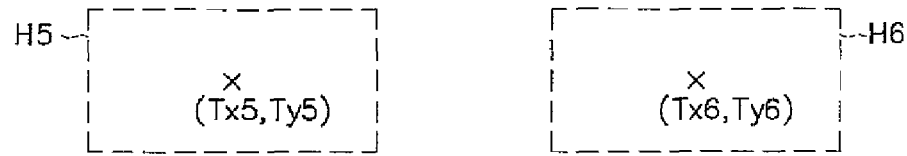
[Figure 21]
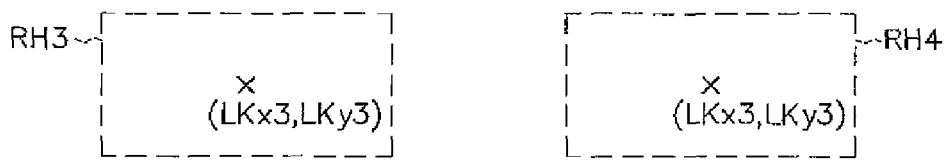
[Figure 22]
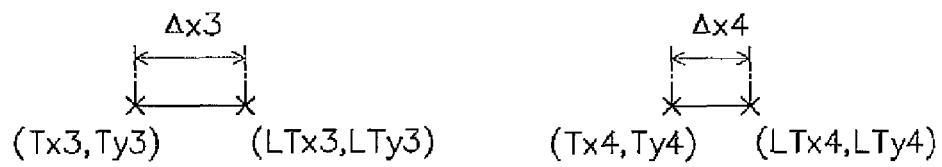
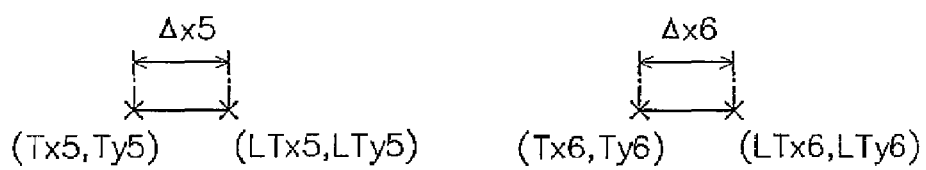

[Figure 23]
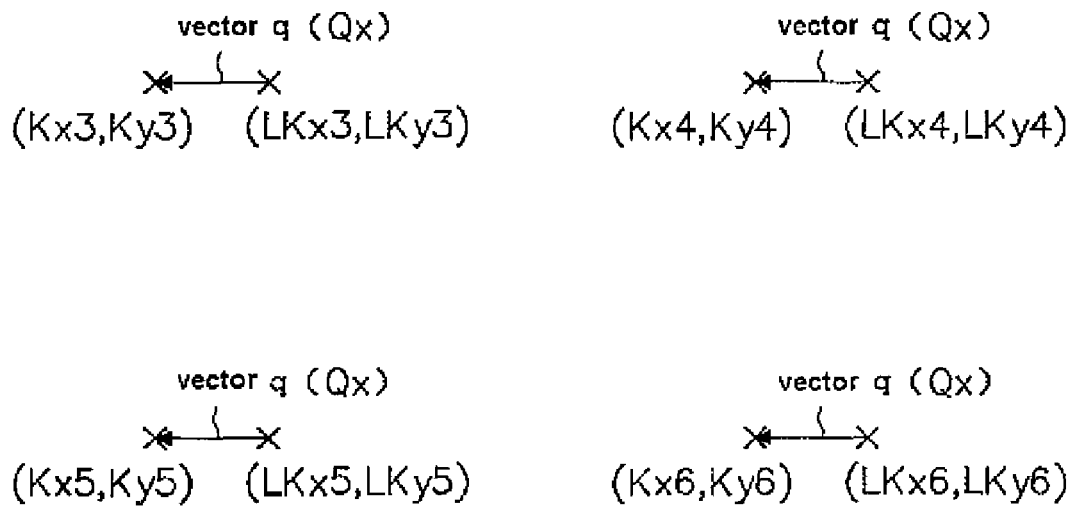

SOLDER PRINTING INSPECTION APPARATUS AND COMPONENT MOUNTING SYSTEM

TECHNICAL FIELD

The present invention relates to an apparatus for inspecting solder printing for inspection of solder printed on a board.

BACKGROUND ART

Generally, when an electronic component is mounted on a printed board, cream solder is firstly printed on the electrode pattern arranged on the printed board. This cream solder printing is carried out by screen printing using a metal screen in which a multiplicity of holes has been formed corresponding to the electrode pattern. The electronic component is provisionally fixed to the printed board printed with the cream solder by the viscosity of this cream solder. Moreover, the electronic component generally is provided with a multiplicity of electrodes and leads, and these electrodes and leads are bonded to their corresponding respective cream solders. That is, a single electronic component is mounted on a group of solders formed from a multiplicity of cream solders. Moreover, after mounting of the electronic component, this printed board is brought to a reflow furnace, and soldering is performed by passage through a certain reflow process. At the stage prior to the reflow process (prior to mounting of the electronic component), the cream solder is inspected, and inspection is performed to determine whether or not the electronic component is loaded properly for the stage after passage through the reflow furnace.

Conventionally, due to the occurrence of time-wise expansion and contraction or due to errors during production of the metal screen and the like, the cream solder can be printed at a position that is shifted from the electrode pattern. In such a case, there are instances of placement of the cream solder with almost no shifting on the electrode pattern when going through the above-mentioned reflow process. This is due to the cream solder melted during the reflow process and operating by spreading across and wetting the electrode pattern face (self alignment effect) due to the reflow process. Here, technology is proposed (e.g., see Patent Citation 1 and the like) when the self alignment effect is anticipated that mounts the electronic component by shifting the electronic component by just the degree of shift or direction of shift when the degree of shift or direction of shift is nearly fixed for various cream solders used for mounting one electronic component, even when the cream solder is printed at a somewhat shifted position.

However, during inspection of cream solder during the stage prior to the reflow process, inspection is based on whether or not the shift amount of the actually printed cream solder is within a previously set range value relative to the ideal cream solder printing position. However, the cream solder positional shift amount during inspection prior to reflow is large, and even through a determination of "failure" may be made, there are instances when a "pass" determination is made after the reflow process due to the previously mentioned self alignment effect. However, when the positional shift of each solder is relatively small, even though a determination of "good" is made during inspection prior to the reflow process, when there is variance in the positional direction of the various solders, the electrodes and the like of the electronic component cannot be loaded on the cream solder, and as a result, there is concern that a "failure" determination may result at the inspection after the reflow process.

That is, there is concern that the results of inspection will become different for the inspection prior to the reflow process versus the inspection after the reflow process.

Consistency should be achieved between the inspection result prior to the reflow process versus the inspection result after the reflow process, and technology has been proposed (see Patent Citation 2 and the like) that makes various types of alterations to the above-mentioned value range that becomes the determination standard of positional shift amount of the cream solder prior to the reflow process. This technology will be explained in detail. When an item determined to be a "failure" during the inspection prior to the reflow process is determined to be a "good" item during inspection after the reflow process, the above-mentioned value range is determined to be excessively narrow, and the value range is made wider than it had been previously. However, when an item determined to be "good" during inspection prior to the reflow process is determined to be a "failure" during inspection after the reflow process, the above-mentioned value range is determined to be excessively wide, and the value range is made narrower than it had been previously.

[Patent Citation 1] Unexamined Laid-open Patent Application No. 2002-84097
[Patent Citation 2] Unexamined Laid-open Patent Application No. 2006-37236

SUMMARY OF INVENTION

However, even when the above-mentioned technology is adopted, it is not possible to entirely resolve the situation that is the discrepancy between the inspection results between the inspection prior to the reflow process versus the inspection after the reflow process. Thus, there is concern that due to widening of the value range, a board determined to be a "failure" during the inspection after the reflow process may be determined to "pass" during the inspection prior to the reflow process. In this case, electronic components are mounted on the failed board, and there is concern that such electronic components may become wasted. However, when the value range is narrowed, despite the board being determined to "pass" during the inspection after the reflow process due to the self alignment effect, there is concern that a determination of "failure" may made during the inspection stage prior to the reflow process, and that this board will become waste and the like. That is, when the above-mentioned technology is adopted, there is concern that the precision of inspection may become insufficient, and that this will invite a lowering of yield and a great increase of production cost.

The present invention was developed in consideration of these circumstances. One or more embodiments of the present invention provide a component mounting system and a solder printing inspection apparatus capable of improvement of precision of inspection due to consistency between the inspection results of the inspection prior to the reflow process versus the inspection after the reflow process, thus improving yield and greatly controlling production cost.

The various means suitable for achieving the above-mentioned aspects of one or more embodiments will be explained item by item. Furthermore, the operational effects particular to the means will be appended as may be required.

In one or embodiments, in a solder printing inspection apparatus for inspection of solder upstream of a component mounting apparatus for mounting electronic components relative to solder printed on a board by a solder printing apparatus; the solder printing inspection apparatus includes: an irradiation means for irradiation of light on solder printed on the board; an ideal solder position generation means, for a solder group including at least two solders for mounting of the electronic components, for generation of ideal solder position information indicating position on the board of the solder including the solder group in design data or in production data; an ideal loading position generation means for generation of ideal loading position information indicating an ideal loading position of the electronic component loaded on the solder group based on the ideal solder position information; an image processing means for generation of actual solder position information indicating the position of solder included in the solder group based on image data imaged by the imaging means and for generation of loading estimate position information indicated a loading estimate position of the electronic component loaded on the solder group based on the actual solder position information; an ideal solder inspection standard generation means for generation of ideal solder inspection standard information indicating a standard inspection position and/or standard inspection range of the solder included in the solder group based on design data or production data or the ideal solder position information; wherein the categories and parameters of the loading estimate position information are the same as the categories and parameters of the ideal loading position information; mounting position adjustment information is found based on positional shift amount and positional shift direction of the loading estimate position information relative to the ideal loading position information, and each solder included in the solder group is inspected using an actual inspection standard information obtained by shifting the ideal solder inspection standard information by just the amount of the mounting position adjustment information; and the mounting position adjustment information is outputted to the component mounting apparatus.

Moreover, the terms "actual solder position information" and "ideal solder position information" indicate relative positions on the solder board that includes the solder group. For example, this information is exemplified by the center or center of mass of the solder region occupied by solder on the board, the center or center of mass of a rectangle circumscribing the solder region, and the like.

Additionally, the term "ideal loading position information" indicates the loading position of the electronic component generated based on the solder position in data. Examples of the ideal loading position information that can be cited are the ideal solder position information itself (i.e. loading position of electrodes or leads of the electronic component in data), center point or center of mass of the ideal solder position information for each solder, and the like. Furthermore, the term "loading estimate position information" indicates the estimated position of loading of the electronic component generated based on the actually printed solder, such as the actual solder position information itself (i.e. loading position of electrodes or leads of the electronic component in data), center point or center of mass of the actual solder position information for each solder, and the like.

For the above-mentioned embodiments, the information generated as the "ideal loading position information" and the "loading estimate position information" requires the same categories and parameters (position information in the same units based on the same point of view and categories). For example, when the actual solder position information is used as the "loading estimate position information," the ideal solder position information must be used as the "ideal loading position information." Moreover, when the center point of the actual solder position information is used as the "loading estimate position information," the center point of the ideal solder position information must be used as the "ideal loading position information."

Moreover, the term "ideal solder inspection standard information" indicates the inspection position or inspection range in design data or production data. The ideal solder inspection standard information is exemplified by an inspection window (ideal inspection window) generated based on ideal solder position information (location of the electrodes or leads of the electronic component in the data) or the solder region (ideal solder region) occupied by each solder in the design data or production data, center or center of mass of the electronic component in the data, and the like.

Additionally, the term "actual position adjustment information" refers to information indicating the extent of the positional shift or direction of shift of the actually printed solder group. For example, when the ideal solder position information is used as the "ideal loading position information" and the actual solder position information is used as the "loading estimate position information," vector components and the like can be used from average values of the positional shift amounts of both solder position information along each direction (e.g., along the X axis direction, Y axis direction, and the like) as the "mounting position adjustment information." Moreover, when the center point of the ideal solder position information of each solder is used as the "ideal loading position information" and the center point of the actual solder position information of each solder is used as the "loading estimate position information," vector components and the like can be used from the positional shift direction and the positional shift amount between both central points as the "mounting position adjustment information."

Furthermore, the term "actual inspection standard information" refers to information indicating the inspection standard position or inspection standard range of the actually printed solder, as exemplified by coordinates (inspection standard coordinates) shifting the above-mentioned ideal solder inspection standard data (coordinate information) by just the above-mentioned vector components and the like, an inspection window (actual inspection frame) shifting the above-mentioned ideal inspection window by just the above-mentioned vector components and the like, etc.

According to the above-mentioned embodiments, each solder of the solder group carrying the electronic component is inspected taking as a standard the inspection standard position (actual inspection standard information) obtained by shifting the inspection standard position (ideal standard inspection standard information) by just the mounting position adjustment information relative to the solder in the ideal printed condition. That is, the standard position of inspection is modified for the electronic component unit (solder group) relative to the actually printed solder position, and each solder is inspected based on this modified standard position. For this reason, in cases where the amount of positional shift of each solder included in the solder group is relatively large and the positional shift amount and positional shift direction are substantially fixed, and the like, when the above-mentioned conventional technology makes a determination of "failure" despite the ability to anticipate the self alignment effect, according to the embodiments, the standard position of inspection is shifted for the solder group unit corresponding to the position of the actually printed solder, and thus a determination of "good" can be made. However, even when the individual positional shift amounts are relatively small and there is variance in the directions of the positional shifts of the individual solders, according to the above-mentioned conventional technology, there have been instances when a determination of "good" is made even though the electronic component can not be mounted properly. In this case according to the embodiments when there is variance in the positional shift directions of the individual solders, due to shifting of the inspection standard position of each solder as a solder group unit, a determination of "failure" can be made since a large shift of a specific solder from the inspection standard position results.

That is, according to the embodiments, during inspection prior to the reflow process, inspection can be performed that takes into account the self alignment effect and the ability/inability to mount the electronic component, and consistency can be obtained in the inspection results between the inspection prior to the reflow process and the inspection after the reflow process. As a result, it is possible to improve the precision of inspection, and thus it is possible to increase yield and suppress increase of production cost.

Moreover, based on the outputted mounting position adjustment information, the component mounting machine is able to mount the electronic component relative to the position where the solder is actually printed. By this means, it is possible to standardize the mounting position of the electronic component for the inspection process and the mounting process, and it is possible to actually anticipate the self alignment effect. For this reason, it is possible to greatly improve manufacturing quality. Furthermore, it is possible for information generated during the inspection process to be used in the mounting process. It is possible to prevent the trouble that is duplication of similar processing also in the mounting process. As a result, manufacturing efficiency can be improved.

In one or more embodiments, the solder printing inspection apparatus may be as described above, wherein the image processing means extracts an actual solder region indicating a solder region occupied on the board by the solder included in the solder group based on the image data; the ideal solder inspection standard information and the actual inspection standard information are inspection window information relating to inspection windows; and the image processing means also inspects each solder included in the solder group based on shift amount of the actual solder region relative to the inspection window information of the actual inspection standard information.

Moreover, the expression "actual solder region" indicates the solder region occupied on the board by the actually printed solder. Examples that can be cited of the actual solder region are a solder planar region, three dimensional region, and the like.

According to these embodiments, for example, pass-fail inspection of each solder region includes the solder group based on the range fraction occupied by the solder region relative to an inspection window (actual inspection window) as the actual inspection standard information. By this means, the above-mentioned operational result can be more reliably attained.

In one or more embodiments, the solder printing inspection apparatus according to the embodiments may be as described above, wherein the ideal solder inspection standard information and the actual inspection standard information are both coordinate data; and each solder included in the solder group is inspected based on amount of shift of the actual solder position information relative to the coordinate data of the actual inspection standard information.

According to these embodiments, for example, pass-fail inspection of each solder region includes the solder group based on the shift amount and the like of the actual solder position information relative to the above-mentioned inspection standard coordinates as the actual inspection standard information. By this means, the above-mentioned operational result can be more reliably attained.

In one or more embodiments, the solder printing inspection apparatus may be as described above, wherein a printing failure signal is output to the component mounting apparatus when the positional shift amount of the loading estimate position relative to the ideal loading position information exceeds a previously set threshold value.

Moreover, the expression "previously set threshold value" may be a threshold value set by the operator and the like. Various types of threshold values may be prepared beforehand corresponding to each solder group and various types of produced boards. The threshold value may be set automatically according to the inspected solder group or produced board (and similarly permissible below).

When the solder is printed greatly shifted relative to the previously determined printing position on the board, most of the solder is not printed on the electrode pattern, and even if the board is subjected to the reflow process, there is concern that the self alignment effect will not be sufficiently demonstrated. That is, even after this type of board has been subjected to the reflow process, the resultant solder remains shifted from the electrode pattern, and there is a high probability of a determination of "failure" during the inspection after the reflow process.

Here, according to these embodiments, when the positional shift of the loading estimate position information relative to the ideal loading position information exceeds a previously set threshold value (e.g., when the solder is printed greatly shifted from the solder printing position in the data, and the like), a printing failure signal is output to the component mounting apparatus. By this means, it is possible to prevent a situation that results in mounting of an electronic component on a board that has a high probability of being determined to be a "failure." This results in the ability to greatly improve yield and greatly suppress the increase of production cost.

In one or more embodiments, the solder printing inspection apparatus may be as described above, wherein a printing failure signal is output to the component mounting apparatus when the positional shift amount of the solder included in the solder group relative to the actual inspection standard information exceeds a previously set threshold value.

According to these embodiments, when the amount of shift of each above-mentioned solder relative to the above-mentioned actual inspection standard position exceeds a previously set threshold value during performance of the inspection based on the actual inspection standard information, the solder group is determined to have a printing failure, and a printing failure signal is output to the component mounting apparatus. By this means, it is possible to prevent the resulting mounting of the electronic component on a board that can be determined to be a "failure," and thus it is possible to improve yield and more greatly suppress the increase of production cost.

Furthermore, when the actual inspection window is used as the above-mentioned actual inspection standard information, when the fraction occupied by the region outside the actual solder region in the actual inspection window is used, or when the inspection standard coordinates are used as the above-mentioned actual inspection standard information, it is possible to cite the positional shift of the actual solder position information relative to the inspection standard coordinates as the above-mentioned shift amount (and similarly permissible below).

In one or more embodiments, the solder printing inspection apparatus may be as described above, wherein each solder group printed on the board is inspected respectively.

According to these embodiments, each solder group printed on the board is subjected to respective inspection, and thus inspection precision can be greatly improved.

In one or more embodiments, a component mounting system includes: a solder printing inspection apparatus, positioned downstream of a solder printing apparatus for printing solder on a board, for inspection of solder on the board; and a component mounting apparatus for mounting electronic components relative to the printed solder; wherein the solder printing inspection apparatus comprises: an irradiation means for irradiation of light on solder printed on the board; an ideal solder position generation means, for a solder group including at least two solders for mounting of the electronic components, for generation of ideal solder position information indicating position on the board of the solder including the solder group in design data or in production data; an ideal loading position generation means for generation of ideal loading position information indicating an ideal loading position of the electronic component loaded on the solder group based on the ideal solder position information; an image processing means for generation of actual solder position information indicating the position of solder included in the solder group based on image data imaged by the imaging means and for generation of loading estimate position information indicated a loading estimate position of the electronic component loaded on the solder group based on the actual solder position information; an ideal solder inspection standard generation means for generation of ideal solder inspection standard information indicating a standard inspection position and/or standard inspection range of the solder included in the solder group based on design data or production data or the ideal solder position information; wherein the categories and parameters of the loading estimate position information are the same as the categories and parameters of the ideal loading position information; mounting position adjustment information is found based on positional shift amount and positional shift direction of the loading estimate position information relative to the ideal loading position information, and each solder included in the solder group is inspected using an actual inspection standard information obtained by shifting the ideal solder inspection standard information by just the amount of the mounting position adjustment information; the mounting position adjustment information is outputted to the component mounting apparatus; and the component mounting system mounts the electronic component at a position found by shifting the ideal loading position by just the actual mounting position adjustment information.

According to these embodiments, effects are achieved that are similar to those of the above-mentioned embodiments.

In one or more embodiments, the component mounting system may be as described above, wherein, when the positional shift amount of the loading estimate position relative to the ideal loading position information exceeds a previously set threshold value, the solder printing inspection apparatus outputs to the component mounting apparatus a printing failure signal, and the component mounting apparatus does not perform mounting processing of the electronic component when the printing failure signal has been input.

According to these embodiments, effects are achieved that are similar to those of the above-mentioned embodiments.

In one or more embodiments, the component mounting system may be as described above, wherein, when the positional shift amount of the solder included in the solder group relative to the actual inspection standard information exceeds a previously set threshold value, the solder printing inspection apparatus outputs to the component mounting apparatus a printing failure signal, and the component mounting apparatus does not perform mounting processing of the electronic component when the printing failure signal has been input.

According to these embodiments, effects are achieved that are similar to those of the above-mentioned embodiments.

In one or more embodiments, the component mounting system may be as described above, wherein the solder printing inspection apparatus performs respective inspection of each solder group printed on the board.

According to these embodiments, effects are achieved that are similar to those of the above-mentioned embodiments.

BRIEF DESCRIPTION OF DRAWINGS

FIG. 1 shows a block diagram showing schematically the structure of the production system.

FIG. 2 shows a partial magnified top view showing schematically the structure of the printed board.

FIG. 3 shows a tilted perspective view showing the configuration of the control apparatus.

FIG. 4 shows a block diagram showing the configuration of the control apparatus.

FIG. 5 shows a partial magnified top view for explanation of the printing condition of the solder in the first embodiment.

FIG. 6 shows a planar outline drawing for explanation of the ideal solder region and ideal solder position information in the first embodiment.

FIG. 7 shows a planar outline drawing for explanation of the ideal loading position information in the first embodiment.

FIG. 8 shows a planar outline drawing for explanation of extraction of the actual solder region in the first embodiment.

FIG. 9 shows a planar outline drawing showing the actual solder region in the first embodiment.

FIG. 10 shows a planar outline drawing for explanation of the actual solder position information in the first embodiment.

FIG. 11 shows a planar outline drawing for explanation of the loading estimate position information in the first embodiment.

FIG. 12 shows a planar outline drawing showing the ideal solder inspection standard information in the first embodiment.

FIG. 13 shows a planar outline drawing showing the mounting position adjustment information in the first embodiment.

FIG. 14 shows a planar outline drawing for explanation of the generation of the actual inspection standard information in the first embodiment.

FIG. 15 shows a planar outline drawing for explanation of inspection of the solder group in the first embodiment.

FIG. 16 shows a planar outline drawing showing the printing condition of the solder in the second embodiment.

FIG. 17 shows a planar outline drawing showing the ideal solder region and ideal solder position information in the second embodiment.

FIG. 18 shows a planar outline drawing showing the ideal loading position information in the second embodiment.

FIG. 19 shows a planar outline drawing showing the actual solder region and actual solder position information in the second embodiment.

FIG. 20 shows a planar outline drawing showing the loading estimate position information in the second embodiment.

FIG. 21 shows a planar outline drawing showing the ideal solder inspection standard information in the second embodiment.

FIG. 22 shows a planar outline drawing for explanation of the mounting position adjustment information and the ideal loading position information in the second embodiment.

FIG. 23 shows a planar outline drawing for explanation of the generation of the actual inspection position information in the second embodiment.

DETAILED DESCRIPTION

Specific details of the present disclosure will now be described in detail with reference to the accompanying figures.

The First Embodiment

FIG. 1 is a pattern diagram showing a transport line corresponding to a production system for production of the printed board. FIG. 2 is a partial magnified top view showing part of the printed board 1 (referred to hereinafter as the "board").

Firstly, configuration of the board 1 will be explained. As shown in FIG. 2, the board 1 has a multiplicity of electrode patterns 2 that have electrical conductivity. Viscous cream solder 3 (referred to hereinafter simply as "solder") is printed on this electrode pattern 2, and electronic components 4, such as chips and the like, are loaded onto the electrode pattern 2. More specifically, the electronic component 4 is provided with a multiplicity of electrodes or leads (not illustrated), and each electrode or lead is bonded to a certain respective solder 3. That is, the electronic component 4 is loaded for each electronic component 4 corresponding to a single solder group 5 formed from a multiplicity of solders 3.

Next, the production system for production of the above-mentioned board 1 will be explained. As shown in FIG. 1, from the starting tip end (left side of the figure) in order along the transport line of the board 1 in the production system 11 of the present embodiment, the production system 11 is provided with a cream solder printing apparatus 12, a component mounting system 13, a reflow apparatus 14, and a component mounting condition inspection apparatus 15.

The above-mentioned cream solder printing apparatus 12 is used for printing a certain amount of solder 3 at certain locations (e.g. on the electrode pattern 2) of the board 1. More specifically, the cream solder printing apparatus 12 is equipped with a metal screen (not illustrated) in which are formed a multiplicity of holes at positions corresponding to the electrode pattern 2 on the board 1, and this metal screen can be used for screen printing of solder 3 on the board 1.

Moreover, the above-mentioned component mounting system is provided with a solder printing inspection apparatus 21 for inspection of the printed solder 3 and a component mounting apparatus 22 for mounting of the electronic component 4 on the printed solder 3 (this will be explained below in detail).

Additionally, the reflow apparatus 14 heats and melts the solder 3 in order to cause bonding between the electrode pattern 2 and the electrodes or leads of the electronic component 4.

Furthermore, the component mounting condition inspection apparatus 15 performs inspections to find out whether or not the electronic component 4 is mounted at a specific position, to confirm whether or not there is suitable electrical connection with the electronic component, and the like.

Next, the characteristic component mounting system 13 in the present embodiment will be explained, beginning with the solder printing inspection apparatus 21. As shown in FIG. 3, the solder printing inspection apparatus 21 is provided with a carrying stage 31 for carrying the board 1, an illumination apparatus 32 as a means for irradiation of the surface of the substrate 1 from above with light at a tilted angle, a CCD camera 22 as an imaging means for imaging of a board 1 irradiated by the light, and a control apparatus 41 for performance of various types of control of the solder printing inspection apparatus 21, image processing, calculation processing, and the like.

The above-mentioned carrying stage 31 is provided with motors 34 and 35 that have mutually orthogonal axes of rotation. Due to operational control of these motors 34 and 35 by the above-mentioned control apparatus 41, the board 1 carried on the carrying stage 31 can slide in an arbitrary direction (X axis direction and Y axis direction). By this means, it becomes possible for the field of the CCD camera 33 to be moved.

The illumination apparatus 32 is able to irradiate a certain light on the board 1. The CCD camera 33 images the board 1 that is irradiated by light of the illumination apparatus 32. The image data imaged by this CCD camera 33 is transferred to a calculation apparatus 43 that will be explained below. In the present embodiment, brightness data due to light reflected from the board 1 are used as the image data. Moreover, rather than brightness data, it is also permissible to transmit color data, height data, and the like of the board 1 as the image data.

Next, the above-mentioned control apparatus 41 will be explained. As shown in FIG. 4, the control apparatus 41 is provided with a memory apparatus 42 for storing various types of data in memory and a calculation apparatus 43 for performing various types of calculations.

The above-mentioned memory apparatus stores in memory calculation results from the above-mentioned calculation apparatus 43, design data of the board 1, production data of the board 1, and the like. In the present embodiment, position or size of the electrode pattern 2 on the board 1, printing estimated position of the solder 3, size of the solder 3 under ideal printing conditions (such as length of the side of the solder 3, surface area, outline length, diagonal line length, volume, and the like), size of the board 1, and the like are stored in this memory apparatus 42 as the design data or production data. Moreover, information concerning which solder 3 the electronic component is loaded on, information concerning which solder group 5 includes the solder 3, and the like are stored in memory.

Moreover, the above-mentioned calculation apparatus 43 is provided with an ideal solder position generation means 44, an ideal loading position generation means 45, an image processing means 46, and an ideal solder inspection standard generation means 47.

The ideal solder position generation means 44 generates an "ideal solder region" which is the solder region of the solder 3 on the board 1 for the solder 3 included in a certain solder group 5 in the production data or design data stored in memory of the above-mentioned memory apparatus 42. Additionally, the ideal solder position generation means 44 also generates "ideal solder position information" which indicates the position of the above-mentioned ideal solder region. In the present embodiment, the planar region occupied by the solder 3 on the board 1 in the data is generated as the "ideal solder region," and the center of mass coordinates (Lx, Ly) of the ideal solder region are generated as the "ideal solder position information." Moreover, the three dimensional region and the like occupied by the solder 3 on the board 1 in the data may be generated as the "ideal solder region." Moreover, center of the ideal solder region, center of a rectangle circumscribing the ideal solder region, center of mass of a rectangle circumscribing the ideal solder region, and the like can also be used as the "ideal solder position information." Moreover, in the present embodiment, the ideal solder region is set to be consistent with the region occupied by the electrode pattern 2 on the board 1.

The above-mentioned ideal loading position generation means 45 generates "ideal loading position information" indicating the loading position of the electronic component 4 loaded on the above-mentioned specific solder group 5 in the design data or production data. In the present embodiment, when two solders 3 are included in the solder group 5, the ideal loading position information is generated as the center (center point) coordinates (LTx, LTy) of the ideal solder position information (Lx, Ly) of each solder 3. When the solder group 5 includes three of more solders 3, the ideal loading position information is generated as center (center of mass) coordinates (LTx, LTy) of the ideal solder position information (Lx, Ly) of each solder 3.

Moreover, processing by the above-mentioned ideal solder position generation means 44 and the ideal loading position generation means 45 is performed in parallel, and the above-mentioned image processing means 46 performs binarization processing of the above-mentioned image data using a certain brightness value as the threshold value. Thus, the planar region occupied by the solder 3 on the board 1 is extracted, and information concerning the planar region of this solder 3 is stored in the memory of the above-mentioned memory apparatus 42. Moreover, extraction of the planar region of the above-mentioned solder 3 may be performed at a stage prior to processing by the above-mentioned ideal solder position generation means 44, or may be performed at a stage prior to processing by the ideal loading position generation means 45. Moreover, the three dimensional region of the solder 3 may be extracted rather than the planar region of the solder 3.

Additionally, the image processing means 46 is made capable of setting a search area and extraction as solder clumps those planar regions of the solders 3 having an area greater than or equal to a certain area value present within this search area. In the present embodiment, the above-mentioned search area has a shape resembling that of the ideal solder region, and the central coordinates of this search area becomes identical to the coordinates of the ideal solder position information (Lx, Ly). However, the above-mentioned search area is set somewhat larger than the ideal solder region.

Moreover, when the planar region of the solder 3 present within the search area is less than a certain surface area, it is determined that positional correction due to the self alignment effect is difficult since this in equivalent to the solder 3 being printing with a large displacement from the ideal printing condition, and a "printing failure signal" is output from the calculation apparatus 43 to the above-mentioned component mounting apparatus 22 (operation of the component mounting apparatus 22 after input of this printing failure signal will be explained later). Moreover, when multiple planar regions of solder 3 are present in the search area that are greater than or equal to a certain surface area (such as 20% of the surface area of the search area, and the like), a "printing failure" signal is output from the above-mentioned calculation apparatus 43 to the component mounting apparatus 22 due to excessively close adjacent solders 2 due to "running" and the like, or due to the occurrence of "blurring." Additionally, planar regions less than a certain area (such as 1% of the search area, and the like) among the planar regions of solder 3 present within the search area are ignored as parts of the solder clumps.

Furthermore, the image processing means 46, based on the information of the planar region of the above-mentioned solder 3 stored in memory of the memory apparatus 42, extracts the "actual solder region" which is a contiguous solder region in the extracted solder clump. That is, each actual solder region included in the certain solder group 5 is extracted.

Moreover, the image processing means 46 generates the "actual solder position information" indicating the position of the above-mentioned actual solder region that was extracted. In the present embodiment, the center of mass coordinates (x, y) of the actual solder region are generated as the "actual solder position information." Moreover, the center of the actual solder region, the center of mass of a rectangle circumscribing the actual solder region, the center of a rectangle circumscribing the actual solder region, and the like may be used as the "actual solder position information." However, the "actual solder position information" must have the same type of parameters as those of the "ideal solder position information" (for example, when central coordinates of the ideal solder region are generated as the ideal solder position information, the central coordinates of the actual solder region must be generated as the actual solder position information).

Additionally, the image processing means 46, based on the above-mentioned actual solder position information, generates a "loading estimate position information" indicating the loading estimate position of the electronic component 4 loaded on the above-mentioned solder group 5. In the present embodiment, when two solders 3 are included in the solder group 5, the loading estimate position information is generated as the center (center point) coordinates (Tx, Ty) of the actual solder position information (x, y) of each solder 3. When three of more solders 3 are included in the solder group 5, the loading estimate position is generated as the center (center of mass) coordinates (Tx, Ty) of the actual solder position information (x, y) of each solder 3.

That is, the ("ideal" or "actual") solder position information central coordinates are generated as the ideal loading position information and the loading estimate position information. However, the categories and parameters of the ideal loading position information are identical to the categories and parameters of the loading estimate position information.

Additionally, processing by the above-mentioned image processing means 46 is performed in parallel, and the above-mentioned ideal solder inspection standard generation means 47 generates "ideal solder inspection standard information" which is within the inspection range corresponding to the above-mentioned ideal solder region. In the present embodiment, an ideal inspection window is generated as the ideal solder inspection standard information, where, based on the above-mentioned ideal solder region, this ideal inspection window has a shape that resembles the shape of the ideal solder region and has the same central coordinates (LKx, LKy) as those of the ideal solder position information (Lx, Ly). However, this ideal inspection window is set somewhat larger than the ideal solder region. Processing by the ideal solder inspection standard generation means 47 may be performed at a stage prior or after the processing of the image processing means 46.

Furthermore, the above-mentioned calculation apparatus 43, based on data generated and extracted by the above-mentioned various means 44 through 47, inspects the solder group 5 on the board 1. Therefore, inspection processing of the solder group 5 by the calculation apparatus 43 will next be explained.

The calculation apparatus 43 generates "mounting position adjustment information" indicating the direction of positional shift and the amount of positional shift of the above-mentioned loading estimate position information (Tx, Ty) relative to the above-mentioned ideal loading position information (LTx, LTy). In the present embodiment, the vector p (i.e. (Px, Py)) is generated as the "mounting position adjustment information" (here, Px is "Tx−LTx," and Py is "Ty−LTy"). Moreover, when the vector p X axis component Px, the Y axis component Py, or the magnitude of the vector p exceeds a certain no. 1 threshold value, it is determined that the solder is printed at a greatly shifted position, and the "printing failure signal" is output to the component mounting apparatus 22. Moreover, the above-mentioned no. 1 threshold value may be set by the operator and the like, various types of threshold values may be prepared corresponding to each solder group 5 and various types of produced boards 1, and the no. 1 threshold value may be set automatically for the inspected solder group 5 or the manufacture board.

Furthermore, the calculation apparatus 43 generates the "actual inspection standard data" by shifting the above-mentioned ideal inspection window by just the above-mentioned mounting position adjustment information (vector p). In the present embodiment, an inspection window (actual inspection window) as the actual inspection window is generated by shifting the above-mentioned ideal inspection window by just the above-mentioned vector p. That is, the actual inspection window has a shape that is identical to that of the above-mentioned ideal inspection window and has central coordinates (Kx, Ky) that are equivalent to the coordinates (LKx+Px, LKy+Py) obtained by shifting the central coordinates (LKx, LKy) of the above-mentioned ideal inspection window by just the above-mentioned vector p (Px, Py).

Additionally, the calculation apparatus 43 performs an inspection to determine whether or not the range fraction occupied by the region outside the actual solder region relative to the above-mentioned actual inspection window exceeds a previously set no. 2 threshold value. Then, when the range fraction occupied by the region outside the actual solder region relative to the actual inspection frame for each solder 3 included in the above-mentioned certain solder group 5 is less than or equal to the above-mentioned no. 2 threshold value, the printing condition of this solder group 5 is determined to be "good." In this case, mounting position adjustment information and ideal loading position information for this solder group 5 is output to the above-mentioned component mounting apparatus 22. However, when the range fraction occupied by the region outside the actual solder region relative to the actual inspection frame exceeds the above-mentioned no. 2 threshold value, the printing condition of the above-mentioned certain solder group 5 is determined to be a "failure," and the "printing failure signal" is output to the component mounting apparatus 22. Moreover, the no. 2 threshold value may be set by the operator and the like, various types of threshold values may be prepared beforehand corresponding to the various solder groups 5 or various types of produced boards 1, and the no. 2 threshold value may be set automatically corresponding to the inspected solder group 5 or the produced board 1.

The calculation apparatus 43 next performs each of the above-mentioned various processing by extraction and memory storage processing of the planar regions of the solder 3 on the board 1 for the solder groups 5 other than the above-mentioned certain solder group 5. Then, when the calculation means makes a determination of "good" for the printing condition of each of the solder groups 5, the board 1 is determined to be a "good product." When the board 1 is determined to be a "good product," ideal loading position information and mounting position adjustment information for each of the solder groups 5 are output to the component mounting apparatus 22.

Next, operation of the above-mentioned component mounting apparatus 22 will be explained. After completion of inspection processing by the solder printing inspection apparatus 21, this component mounting apparatus 22 mounts the electronic components 4 of each of the solder groups 5 such that the center of the electronic component 4 is positioned at a location found by shifting the "ideal loading position information" by just the "mounting position adjustment information" (vector p). That is, each electronic component 4 is mounted at the position corresponding to the location where the respective solder group 5 is actually printed. Moreover, when a "printing failure signal" is outputted from the calculation apparatus 43, the component mounting apparatus 22 does not perform mounting of the electronic components 4 on the board 1, and this board 1 is sent to a non-illustrated failed product hopper.

Next, inspection processing of the solder group 5 by the solder inspection apparatus 21 configured in the above-mentioned manner and mounting processing of the electronic component 4 by the component mounting apparatus 22 will be explained using specific examples. Moreover, for convenience during the explanation, the inspection processing will be explained for a solder group 5a (see FIG. 5) formed from a solder 3a and a solder 3b printed on an electrode pattern 2a and 2b, respectively. However, inspection processing for the other solder groups 5 is performed in a similar manner.

Firstly, size of the solders 3a and 3b and printing condition of the solders 3a and 3b will be described for the explanation of inspection processing of the solder group 5a.

As shown in FIG. 5, the solders 3a and 3b have the same size. For example, the X axis direction width is 3 mm and the Y axis direction width is 5 mm (however, these values are all hypothetical values). Moreover, the solder 3a is printed 2 mm displaced in the X axis direction and printed 1 mm displaced in the Y axis direction relative to the electrode pattern 2a. However, solder 3b is printed 2 mm displaced in the X axis direction and printed 2 mm displaced in the Y axis direction relative to the electrode pattern 2b. Moreover, the solders 3a and 3b are printed using the ideal size.

Firstly, the "ideal solder region" and the "ideal solder position information" are generated by the above-mentioned ideal solder position generation means 44 from the design data and the like stored in memory of the memory apparatus 42. That is, as shown in FIG. 6, the ideal solder region RH1 of the solder 3a in the design data or the production data and the ideal solder position information (Lx1, Ly1) of the ideal solder region RH1 are generated, and the ideal solder region RH2 of the solder 3b in the design data or the production data and the ideal solder position information (Lx2, Ly2) of the ideal solder region RH2 are generated.

Next, the "ideal loading position information" is generated by the above-mentioned ideal loading position generation means 45. That is, as shown in FIG. 7, the central (center point) coordinates of the ideal solder region RH1 ideal solder position information (Lx1, Ly1) and the ideal solder region RH2 ideal solder position information (Lx2, Ly2) are generated as the ideal loading position information.

Moreover, together with extraction of the planar region occupied by the solder 3 on the board 1 by the image processing means 46, information concerning this planar region is stored in memory of the memory apparatus 42.

Furthermore, the image processing means 46 extracts the "actual solder regions" of the solders 3a and 3b. That is, as shown in FIG. 8, in addition to having the same central coordinates as those of the above-mentioned solder regions RH1 and RH2 (omitted from figure), search areas SA1 and SA2 are set somewhat large than the above-mentioned ideal solder regions RH1 and RH2, and clumps (solder clumps K1 and K2) of solders 3a and 3b are extracted which are present within these search areas SA1 and SA2, respectively. Then as shown in FIG. 9, based on the planar region occupied by the above-mentioned solder 3, the actual solder regions H1 and H2 contiguous with the solder clumps K1 and K2, respectively, are extracted.

Moreover, as shown in FIG. 10, the image processing means 46 generates as "actual solder position information" the above-mentioned actual solder region H1 center of mass coordinates (x1, y1) and the above-mentioned actual solder region H2 center of mass coordinates (x2, y2).

Additionally, as shown in FIG. 11, the "loading estimate position information" of the electronic component 4 is generated. That is, the central (center point) coordinates (Tx, Ty) of the actual solder region H1 actual solder position information (x1, y1) and the actual solder region H2 actual solder position information (x2, y2) are generated.

Furthermore, the "ideal solder inspection standard information" is generated by the above-mentioned ideal solder inspection standard generation means 47. That is, as shown in FIG. 12, a rectangular ideal inspection window RW1 having central coordinates (LKx1, LKy1) that are the same as the central coordinates (Lx1, Ly1) of the ideal solder region RH1 and somewhat larger is size than the ideal solder region RH1 is generated, and a rectangular ideal inspection window RW2 having central coordinates (LKx2, LKy2) that are the same as the central coordinates (Lx2, Ly2) of the ideal solder region RH2 and somewhat larger in size than the ideal solder region RH2 is generated.

Next, the above-mentioned calculation apparatus 43 generates the "actual position adjustment information." That is, as shown in FIG. 13, the vector p (i.e. Px, Py) indicated the positional shift amount and positional shift direction between the ideal loading position information (LTx, LTy) and the loading estimate position information (Tx, Ty) is generated.

Furthermore, as shown in FIG. 14, the actual inspection windows W1 and W2 are generated by sifting the above-mentioned ideal inspection widows RW1 and RW2, respectively, by just the vector p. That is, the actual inspection window W1 has the same shape as that of the ideal inspection window RW1, and the central coordinates (Kx1, Ky1) of the actual inspection window W1 become the same as the coordinates (LKx1+Px, LKy1+Py) found by shifting the central coordinates (LKx1, LKy1) of the above-mentioned ideal inspection window RW1 by just the vector p (Px, Py). Also the actual inspection window W2 has the same shape as that of the ideal inspection window RW2, and the central coordinates (Kx2, Ky2) of the actual inspection window W2 become the same as the coordinates (LKx2+Px, LKy2+Py) found by shifting the central coordinates (LKx2, LKy2) of the above-mentioned ideal inspection window RW2 by just the vector p (Px, Py).

Additionally, as shown in FIG. 15, the range fractions occupied by the region outside the actual solder regions H1 and H2 with respect to the above-mentioned actual inspection windows W1 and W2, respectively, are inspected to find whether or not the previously determined no. 2 threshold value is exceeded. Then, when the range fraction occupied by the region outside the actual solder region H1 with respect to the actual inspection frame W1 is less than or equal to the above-mentioned no. 2 threshold value, and when the range fraction occupied by the region outside the actual solder region H2 with respect to the actual inspection frame W2 is less than or equal to the above-mentioned no. 2 threshold value, the printing condition of this solder group 5a is determined to be "good." Also at this time, the actual position adjustment information (vector p) and the ideal loading position information (LTx, LTy) for this solder group 5a are output to the component mounting apparatus 22. However, when at least one member of the solders 3a and 3b has a range fraction occupied by the region outside the actual solder region H1 (H2) relative to the actual inspection frame W1 (W2) that exceeds the above-mentioned no. 2 threshold value, then the printing condition of the above-mentioned certain solder group 5 is determined to be "failed," and the "printing failure signal" is output to the component mounting apparatus 22.

Then, the above-mentioned inspection is performed for the other solder groups (other than the solder group 5a) on the board 1 by extraction and memory storage processing of the planar regions of the solders 3, and when a determination of "good" is made for each solder group 5, the board 1 is determined to be a "good product." However, if any of the solder groups 5 are determined to be a "failure," the board 1 is determined to be a "failure." Then when a determination of "failure" has been made, the "printing failure signal" is output to the above-mentioned component mounting apparatus 22.

After completion of inspection by the solder printing inspection apparatus 21, the component mounding apparatus mounts each electronic component 4 at a position shifting the above-mentioned ideal loading position information by just the mounting position adjustment information. For example, for the above-mentioned solder group 5a, the electronic component 4 is mounted such that the center of the electronic component is positioned at the ideal loading position information (LTx, LTy) shifted by just the vector p. When a "printing failure signal" is input from the calculation apparatus 43, mounting of the electronic component 4 on the board 1 is not performed, and his board 1 is sent to the above-mentioned failed product hopper.

According to the solder printing inspection apparatus 21 (component mounting system 13) of the present embodiment as described previously, the inspection standard position (actual inspection standard information) obtained by shifting the inspection standard position (ideal solder inspection position information) for the solder 3 of the ideal printing condition by just the mounting position adjustment information is taken as a standard while the various solders 3 of the solder group 5 carrying the electronic component 4 is inspected. That is, according to the position of the actually printed solder 3, the standard position of inspection is changed for the electronic component 4 (solder group 5) unit, and inspection of each solder 3 is performed based on this changed standard position. For this reason, when the positional shift of each solder 3 included in the solder group 5 is comparatively large, and when the positional shift amount and positional shift direction are approximately fixed and the like, although the above-mentioned conventional technology would make a determination of "failure" despite the ability to anticipate the self alignment effect, the present embodiment makes possible a determination of "good" due to the standard position of inspection being shifted for the solder group 5 unit corresponding to the position where the solder 3 is actually printed. However, even when the positional shift amounts of the individual solders 3 are relatively small, when there is variance of the positional shift directions of the individual solders 3, despite the above-mentioned conventional technology making a determination of "good" without being able to properly mount the electronic component 4, based on the shifting of each solder 3 inspection standard position as a solder group 5 unit, the present embodiment in this respect (when there is variance of the positional shift directions of the individual solders 3) is able to make a determination of "failure" due to the large shift of a specific solder 3.

That is, in the inspection prior to the reflow process, it is possible to perform inspection that considers the ability to mount the electronic component 4 and the self alignment effect, and it is possible to make the results of inspection between inspection prior to the reflow process and the inspection after the reflow process consistent. As a result, it is possible to improve precision of inspection and, thus, it is possible to improve yield and suppress increase of production cost.

Moreover, based on the output mounting position adjustment information, the component mounting apparatus 22 is able to mount the electronic component 4 at the position where the solder is actually printed. By this means, the mounting position of the electronic component 4 according to the inspection step and the mounting step can be made to agree, and an actual self alignment effect can be anticipated. For this reason, it is possible to greatly improve production quality. Also, information generated during the inspection process can be used in the mounting process, and it is possible to prevent trouble due to duplication of similar processing as that of the inspection process during the mounting process. An improvement of production efficiency can be anticipated by this means.

When the positional shift (Px or Py of the vector p or the magnitude of vector p) of the loading estimate position information (Tx, Ty) relative to the ideal loading position (LTx, LTy) exceeds the previously set no. 1 threshold value (that is, when the actual solder region is printed at a great shift relative to the ideal solder region), the printing failure signal is output to the component mounting apparatus 22. By this means, it is possible to prevent circumstances such as mounting of the electronic component 4 on a board 1 that has a high probability of being determined to be a "failure."

Additionally, when inspection is performed based on the actual inspection standard information, when the shift amount of the above-mentioned actual solder position information relative to the actual inspection standard information exceeds the previously set no. 2 threshold value, the solder group 5 is determined to have a printing failure, and a printing failure signal is output to the component mounting apparatus 22. By this means, it is possible to prevent the mounting of the electronic component 4 on a board that can be determined to be a "failure," and, thus, yield is greatly improved and it is possible to more greatly suppress the increase of production cost.

The Second Embodiment

Next, the second embodiment will be explained while referring to figures and mainly explaining points of particular difference with the above-mentioned first embodiment.

According to the above-mentioned first embodiment, the ideal loading position generation means 45 generates the ideal solder position information (Lx, Ly) central coordinates (LTx, LTy) of each solder 3 as the "ideal loading position information." In contrast, according to the present second embodiment, the ideal loading position generation means 45 generates (LTx, LTy), which are the same coordinates as those of the ideal solder position information (Lx, Ly) of each solder 3 included in the above-mentioned solder group 5, as the "ideal loading position information." Then, the image processing means 46 generates (Tx, Ty), which are the same coordinates as the actual solder position information (x, y), as the "loading estimate position information." That is, in the present embodiment, a multiplicity of coordinates are generated that show the location of the electrodes and the leads of the electronic component 4 loaded on the solder group 5 as the ideal loading position information and the loading estimate position information. Moreover, coordinates identical to the ("ideal" or "actual") solder position information are generated as the ideal loading position information and the loading estimate position information. That is, also according to the present embodiment, similarly to the above-mentioned first embodiment, the categories and parameters of the ideal loading position information become identical to the categories and parameters of the loading estimate position information.

Furthermore, the ideal solder inspection standard generation means 47 generates (LKx, LKy), which are coordinates that are identical to the central coordinates (Lx, Ly) of the ideal solder region, as the "ideal solder inspection standard information."

Additionally, as the "mounting position adjustment information," the calculation apparatus 43 generates a vector q (i.e. (Qx, Qy)) formed from an average value (Qx) of the positional shift amount Δx along the X axis direction of the above-mentioned loading estimate position information (Tx, Ty) relative to the above-mentioned ideal loading position information (LTx, LTy) and an average value (Qy) of the positional shift Δx amount [sic] along the Y axis.

Moreover, the calculation apparatus 43 is able to generate the "actual inspection standard information" by shifting of the above-mentioned ideal solder inspection standard information by just the above-mentioned vector q. In the present embodiment, the above-mentioned ideal solder inspection standard information (LKx, LKy) is shifted by just the above-mentioned vector q to the coordinates (Kx, Ky) to generate the actual inspection standard information.

Furthermore, the calculation apparatus 43 is able to inspect whether or not the absolute value of the shift amount along the X axis direction and the Y axis direction of the actual solder position information relative to the above-mentioned actual standard information is within a previously set certain threshold value (2 mm according to the present embodiment). At this time, when the above-mentioned positional shift amounts are less than or equal to the above-mentioned threshold value for each of the solders 3, the printing condition of the solder group 5 is determined to be "good." However, when at least one solder 3 included in the solder group 5 has the above-mentioned positional shift amount exceeding the above-mentioned threshold value, then the printing condition of the solder group 5 is taken to be "failed," and the "printing failure signal" is output to the component mounting apparatus 22.

Next, inspection processing of the solder group 5 by the solder printing inspection apparatus 21 in the present embodiment and a specific example of mounting processing of the electronic component 4 by the component mounting apparatus 22 will be explained. Moreover, for convenience during the explanation, although inspection processing is explained for a solder group 5b formed from the solders 3c, 3d, 3e, and 3f printed on the electrode patterns 2c, 2d, 2e, and 2f, respectively, during inspection processing, similar processing is performed for other solder groups 5.

The size and printing condition of the solders 3c through 3f on the board 1 targeted for inspection will be firstly described to explain inspection processing of the solder printing inspection apparatus 21.

As shown in FIG. 16, the solders 3c through 3f are solders of the same size. For example, the X axis direction width is 20 mm, and the Y axis direction width is 10 mm (however, the above-mentioned values are all hypothetical values). Moreover, the solder 3c is printed displaced by 7 mm in the X axis direction relative to the electrode pattern 2c, and the solder 3d is printed 5 mm displaced in the X axis direction relative to the electrode pattern 2d. Additionally, the solder 3e is printed 6 mm displaced in the X axis direction relative to the electrode pattern 2e, and the solder 3f is printed displaced by 6 mm in the X axis direction relative to the electrode pattern 2f. However, the solders 3c through 3f are printed with no shift in the Y axis direction. Also the printed sizes of the solders 3c through 3f are all the respective ideal sizes.

Firstly, as shown in FIG. 17, the ideal solder position generation means 44 generates ideal solder regions RH3, RH4, RH5, and RH6 in the design data or production data of each solder 3c through 3f and generates ideal solder position information (Lx3, Ly3), (Lx4, Ly4), (Lx5, Ly5), and (Lx6, Ly6) which are the center of mass coordinates of the ideal solder regions RH3 through RH6.

Moreover, the ideal loading position generation means 45 generates ideal loading position information of the electronic component 4 loaded on the solder group 5b. That is, as shown in FIG. 18, coordinates (LTx3, LTy3), (LTx4, LTy4), (LTx5, LTy5), and (LTx6, LTy6) (which are identical to the ideal solder position information (Lx3, Ly3), (Lx4, Ly4), (Lx5, Ly5), and (Lx6, Ly6)) are generated as the ideal loading position information.

Furthermore, as shown in FIG. 19, the image processing means 46 extracts the actual solder regions H3, H4, H5, and H6 of the solders 3c through 3f from the image data of the CCD camera 33, and the image processing means 46 generates actual solder position information (x3, y3), (x4, y4), (x5, y5), and (x6, y6) which are center of mass coordinates of the various actual solder regions H3 through H6.

Moreover, the loading estimate position information is generated by the image processing means 46. That is, as shown in FIG. 20, coordinates (Tx3, Ty3), (Tx4, Ty4), (Tx5, Ty5), and (Tx6, Ty6) are generated as the loading estimate position information which is the same as the actual solder position information (x3, y3), (x4, y4), (x5, y5), and (x6, y6).

Furthermore, as shown in FIG. 21, coordinates (LKx3, LKy3), (LKx4, LKy4), (LKx5, LKy5), and (LKx6, LKy6) are generated by the ideal solder inspection standard generation means 47 as the ideal solder inspection standard information which is the same as the actual solder position information (LKx3, LKy3), (LKx4, LKy4), (LKx5, LKy5), and (LKx6, LKy6).

Additionally, as shown in FIG. 22, the positional shift Δx3 in the X axis direction of the loading estimate position information (Tx3, Ty3) relative to the ideal loading position information (LTx3, LTy3), the positional shift Δx4 in the X axis direction of the loading estimate position information (Tx4, Ty4) relative to the ideal loading position information (LTx4, LTy4), the positional shift Δx5 in the X axis direction of the loading estimate position information (Tx5, Ty5) relative to the ideal loading position information (LTx5, LTy5), and the positional shift Δx6 in the X axis direction of the loading estimate position information (Tx6, Ty6) relative to the ideal loading position information (LTx6, LTy6) are generated by the calculation apparatus 43. Then, the average value Qx ((Δx3+Δx4+Δx5+Δx6)/4) of the all of the X axis direction positional shift amounts is generated. In the present embodiment, Δx3 becomes 7 mm, Δx4 becomes 5 mm, Δx5 becomes 6 mm, and Δx6 becomes 6 mm. Moreover, Qx becomes 6 mm as the average of these values. Moreover, the calculation apparatus 43 generates the positional shift Δy amounts along the Y axis direction for the loading estimate position information relative to the ideal loading position information and also generates the average value Qy of the positional shift Δy amounts. Here, since each of the solders 3c through 3f is printed without a positional shift in the Y axis direction, the positional shift Δy amounts and the average value Qy thereof all become 0 mm. That is, in the present embodiment, the vector q becomes (6, 0).

Furthermore, as shown in FIG. 23, for each of the solders 3c through 3f, the calculation apparatus 43 generates actual inspection standard information (Kx3, Ky3), (Kx4, Ky4), (Kx5, Ky5), and (Kx6, Ky6) by sifting the ideal solder inspection standard information (LKx3, LKy3), (LKx4, LKy4), (LKx5, LKy5), and (LKx6, LKy6) by just the vector q (Qx in the X axis direction).

Then, the calculation apparatus 43 performs inspection by determination of whether or not the absolute value of the positional shift amounts along the Y axis direction and the X axis direction of the actual solder position information (x3, y3), (x4, y4), (x5, y5), and (x6, y6) relative to the actual inspection standard information (Kx3, Ky3), (Kx4, Ky4), (Kx5, Ky5), and (Kx6, Ky6) exceeds a previously set threshold value. In the present embodiment, the absolute value of the positional shift amount along the X axis direction for the solder 3c becomes 1 mm, the absolute value of the positional shift amount along the X axis direction for the solder 3d becomes 1 mm, the absolute value of the positional shift amount along the X axis direction for the solder 3e becomes 0 mm, and the absolute value of the positional shift amount along the X axis direction for the solder 3f becomes 0 mm. However, the absolute value of the positional shift amount along the Y axis direction for the solders 3c through 3f all become 0 mm. Therefore, because the absolute values of the positional shift amounts along the X axis direction and the Y axis direction do not exceed the above-mentioned threshold value (2 mm), the solder group 5b is determined to be "good." Then, the mounting position adjustment information and the ideal loading position information are output to the component mounting apparatus 22 for this solder group 5b.

Then, the above-mentioned inspection processing is performed for the other solder groups 5 (other than solder group 5b) on the board 1. If each solder group 5 is determined to be "good," then the board 1 is determined to be a "good product." However, if any of the solder groups 5 is determined to be a "failure," then the board 1 is determined to be a "failure." Then, when a determination of "failure" is made, the "printing failure signal" is output to the above-mentioned component mounting apparatus 22.

According to the second embodiment as described above, an operational effect is achieved that is the same as that of the above-mentioned the first embodiment.

Moreover, the embodiments of the present invention are not limited to the above description and, for example, various other embodiments may be also implemented in the following manner. Of course, the description below is merely exemplary and other examples and modified examples are possible.

In the above-mentioned embodiments, inspection processing is performed for each solder group 5. However, it is also permissible for inspection processing to be performed only for certain solder groups 5 selected by the operator and the like. By this means, the inspection processing can be simplified, and manufacturing efficiency can be improved. Moreover, in this case, it is permissible to use the average of the actual position adjustment information of a certain solder group 5 as the actual position adjustment information of solder groups 5 other than the certain solder group 5.

In the above-mentioned embodiments, the vector p (q) is generated as the "mounting position adjustment information," and the electronic component 4 is mounted at a position found by shifting the ideal loading position information by just this vector p (q). That is, the electronic component 4 is mounted at a position found by shifting the ideal loading position information in the X axis direction and the Y axis direction. In contrast, it is permissible to generate the rotational amount and rotational direction of the loading estimate position information relative to the ideal loading position information as the mounting position adjustment information, and to adjust the mounting position of the electronic component 4 based on this rotational amount and rotational direction. Moreover, it is permissible to generate the above-mentioned vector information and the above-mentioned rotational amount and rotational direction as the mounting position adjustment information, and it is permissible to adjust the mounting position of the electronic component 4 based on this mounting position adjustment information.

In the above-mentioned first embodiment, pass-failure is determined for the solder group 5 according to whether or not the range fraction occupied by the region outside the actual solder region relative to the above-mentioned actual inspection window exceeds a certain no. 2 threshold value. In contrast it is also permissible for pass-failure to be determined for the solder group 5 according to whether or not the positional shift of the actual solder position information (x, y) relative to the actual inspection window central coordinates (Kx, Ky) exceeds a certain no. 2 threshold value.

According to the above-mentioned embodiments, inspection processing is performed taking as a pass-fail determination standard for the solder group 5 the range fraction occupied by the region outside of the actual solder region relative to the actual inspection standard information (actual inspection frame and the like) or the positional shift of the actual solder position information relative to the actual inspection standard information (coordinate information). However, the determination standard is not limited to these items. For example, pass-fail determination of the solder group 5 may be performed based on the degree of matching of the actual solder region relative to the actual inspection window as the actual inspection standard information.

Although no particular mention is made in the above-mentioned embodiments, it is permissible for inspection processing by the solder printing inspection apparatus 21 to finish at the point that a "printing failure signal" is output during inspection of a certain solder group 5. In this case, it is possible to suppress continuation of further inspection of the board 1 which will become a failed product, and it is possible to improve inspection efficiency.

According to the above-mentioned embodiments, the search area (ideal or actual) or inspection window is set larger than the ideal solder region. However, it is permissible for the size of the search area or inspection window to be set equivalent to that of the ideal solder region.

According to the above-mentioned embodiments, the ideal solder position generation means 44 generates the ideal solder region, and the ideal solder position information is generated from this ideal solder region. However, it is permissible for the ideal solder position information to be generated directly from the design data or production data without generation of the ideal solder region.

According to the above-mentioned embodiments, the ideal solder inspection standard generation means 47 generates ideal solder inspection standard information based on the ideal solder region. However, it is permissible to store in memory beforehand information concerning the inspection standard position or inspection standard range as design data or production data and to generate the ideal solder inspection standard information based on this information.

Although no particular mention is made in the above-mentioned embodiments, when the "printing failure signal" is output during inspection of a multiplicity of solder groups 5, there is concern that the metal screen may be placed at a position that is shifted relative to the board 1. In this case, for this reason, the shift of the metal screen should be corrected, and the solder printing position of the solder printing apparatus 11 may be adjusted (movement of the metal screen) based on the mounting position adjustment information (vector p) generated for each of the solder groups 5.

DESCRIPTION OF ITEM NUMERALS

1 . . . printed board
3, 3a, 3b, 3c, 3d, 3e, 3f . . . solder
4 . . . electronic component
5, 5a, 5b . . . solder group
11 . . . cream solder printing apparatus as a solder printing apparatus
13 . . . component mounting system
21 . . . solder printing inspection apparatus
22 . . . component mounting apparatus
32 . . . illumination apparatus as an illumination means
33 . . . CCD camera as an imaging means
44 . . . ideal solder position generation means
45 . . . ideal loading position generation means
46 . . . image processing means
47 . . . ideal solder inspection standard generation means
H1, H2, H3, H4, H5, H6 . . . actual solder region
RH1, RH2, RH3, RH4, RH5, RH6 . . . ideal solder region
RW1, RW2 . . . ideal inspection frame as ideal solder inspection standard information
W1, W2 . . . actual inspection frame as actual inspection position information

What is claimed is:

1. A solder printing inspection apparatus for inspection of solder upstream of a component mounting apparatus for mounting electronic components relative to solder printed on a board by a solder printing apparatus, the solder printing inspection apparatus comprising:
    an irradiation means for irradiation of light on solder printed on the board;
    an imaging means for obtaining image data of the solder irradiated by the light;
    an ideal solder position generation means, for a solder group including at least two solders for mounting of the electronic components, for generation of ideal solder position information indicating a position on the board of the solder including the solder group in design data or in production data;
    an ideal loading position generation means for generation of ideal loading position information indicating an ideal loading position of the electronic component loaded on the solder group based on the ideal solder position information;
    an image processing means for generation of actual solder position information indicating a position of solder included in the solder group based on the image data obtained by the imaging means and for generation of loading estimate position information indicating a loading estimate position of the electronic component loaded on the solder group based on the actual solder position information;
    an ideal solder inspection standard generation means for generation of ideal solder inspection standard information indicating a standard inspection position and/or standard inspection range of the solder included in the solder group based on design data or production data or the ideal solder position information;
    wherein the categories and parameters of the loading estimate position information are the same as the categories and parameters of the ideal loading position information;

mounting position adjustment information is found based on positional shift amount and positional shift direction of the loading estimate position information relative to the ideal loading position information, and each solder included in the solder group is inspected using an actual inspection standard information obtained by shifting the ideal solder inspection standard information by just the amount of the mounting position adjustment information; and the mounting position adjustment information is outputted to the component mounting apparatus.

2. The solder printing inspection apparatus according to claim 1;
wherein the image processing means extracts an actual solder region indicating a solder region occupied on the board by the solder included in the solder group based on the image data;
the ideal solder inspection standard information and the actual inspection standard information are inspection window information relating to inspection windows; and
the image processing means also inspects each solder included in the solder group based on shift amount of the actual solder region relative to the inspection window information of the actual inspection standard information.

3. The solder printing inspection apparatus according to claim 2;
wherein each solder group printed on the board is inspected respectively.

4. The solder printing inspection apparatus according to claim 1;
wherein the ideal solder inspection standard information and the actual inspection standard information are both coordinate data; and
each solder included in the solder group is inspected based on amount of shift of the actual solder position information relative to the coordinate data of the actual inspection standard information.

5. The solder printing inspection apparatus according to claim 4;
wherein each solder group printed on the board is inspected respectively.

6. The solder printing inspection apparatus according to claim 1;
wherein a printing failure signal is output to the component mounting apparatus when the positional shift amount of the loading estimate position relative to the ideal loading position information exceeds a previously set threshold value.

7. The solder printing inspection apparatus according to claim 6;
wherein each solder group printed on the board is inspected respectively.

8. The solder printing inspection apparatus according to claim 1;
wherein a printing failure signal is output to the component mounting apparatus when the positional shift amount of the solder included in the solder group relative to the actual inspection standard information exceeds a previously set threshold value.

9. The solder printing inspection apparatus according to claim 8;
wherein each solder group printed on the board is inspected respectively.

10. The solder printing inspection apparatus according to claim 1;
wherein each solder group printed on the board is inspected respectively.

11. A component mounting system comprising:
a solder printing inspection apparatus, positioned downstream of a solder printing apparatus for printing solder on a board, for inspection of solder on the board; and
a component mounting apparatus for mounting electronic components relative to the printed solder, the solder printing inspection apparatus comprising:
an irradiation means for irradiation of light on solder printed on the board;
an imaging means for obtaining image data of the solder irradiated by the light;
an ideal solder position generation means, for a solder group including at least two solders for mounting of the electronic components, for generation of ideal solder position information indicating a position on the board of the solder including the solder group in design data or in production data;
an ideal loading position generation means for generation of ideal loading position information indicating an ideal loading position of the electronic component loaded on the solder group based on the ideal solder position information;
an image processing means for generation of actual solder position information indicating a position of solder included in the solder group based on the image data obtained by the imaging means and for generation of loading estimate position information indicating a loading estimate position of the electronic component loaded on the solder group based on the actual solder position information;
an ideal solder inspection standard generation means for generation of ideal solder inspection standard information indicating a standard inspection position and/or standard inspection range of the solder included in the solder group based on design data or production data or the ideal solder position information;
wherein the categories and parameters of the loading estimate position information are the same as the categories and parameters of the ideal loading position information;
mounting position adjustment information is found based on positional shift amount and positional shift direction of the loading estimate position information relative to the ideal loading position information, and each solder included in the solder group is inspected using an actual inspection standard information obtained by shifting the ideal solder inspection standard information by just the amount of the mounting position adjustment information;
the mounting position adjustment information is outputted to the component mounting apparatus; and
the component mounting system mounts the electronic component at a position found by shifting the ideal loading position by just the actual mounting position adjustment information.

12. The component mounting system according to claim 11;
wherein, when the positional shift amount of the loading estimate position relative to the ideal loading position information exceeds a previously set threshold value, the solder printing inspection apparatus outputs to the component mounting apparatus a printing failure signal, and the component mounting apparatus does not perform mounting processing of the electronic component when the printing failure signal has been input.

13. The component mounting system according to claim 12;
wherein the solder printing inspection apparatus performs respective inspection of each solder group printed on the board.

14. The component mounting system according to claim 11;
wherein, when the positional shift amount of the solder included in the solder group relative to the actual inspection standard information exceeds a previously set threshold value, the solder printing inspection apparatus outputs to the component mounting apparatus a printing failure signal, and the component mounting apparatus does not perform mounting processing of the electronic component when the printing failure signal has been input.

15. The component mounting system according to claim 14;
wherein the solder printing inspection apparatus performs respective inspection of each solder group printed on the board.

16. The component mounting system according to claim 11;
wherein the solder printing inspection apparatus performs respective inspection of each solder group printed on the board.

17. A method for inspection of solder upstream of a component mounting apparatus for mounting electronic components relative to solder printed on a board by a solder printing apparatus, the method comprising:
irradiating light on solder printed on the board;
obtaining image data of the solder irradiated by the light;
generating, for a solder group including at least two solders for mounting of the electronic components, ideal solder position information indicating a position on the board of the solder including the solder group in design data or in production data;
generating ideal loading position information indicating an ideal loading position of the electronic component loaded on the solder group based on the ideal solder position information;
generating actual solder position information indicating a position of solder included in the solder group based on the image data of the solder irradiated by the light and for generation of loading estimate position information indicating a loading estimate position of the electronic component loaded on the solder group based on the actual solder position information;
generating ideal solder inspection standard information indicating a standard inspection position and/or standard inspection range of the solder included in the solder group based on design data or production data or the ideal solder position information;
wherein the categories and parameters of the loading estimate position information are the same as the categories and parameters of the ideal loading position information;
mounting position adjustment information is found based on positional shift amount and positional shift direction of the loading estimate position information relative to the ideal loading position information, and each solder included in the solder group is inspected using an actual inspection standard information obtained by shifting the ideal solder inspection standard information by just the amount of the mounting position adjustment information; and
the mounting position adjustment information is outputted to the component mounting apparatus.

18. The method according to claim 17,
wherein the ideal solder inspection standard information and the actual inspection standard information are inspection window information relating to inspection windows, and
the method further comprising:
extracting an actual solder region indicating a solder region occupied on the board by the solder included in the solder group based on the image data; and
inspecting each solder included in the solder group based on shift amount of the actual solder region relative to the inspection window information of the actual inspection standard information.

19. A computer program product embodied on a non-transitory computer readable medium for performing operations of inspection of solder upstream of a component mounting apparatus for mounting electronic components relative to solder printed on a board by a solder printing apparatus, the operations comprising:
irradiating light on solder printed on the board;
obtaining image data of the solder irradiated by the light;
generating, for a solder group including at least two solders for mounting of the electronic components, ideal solder position information indicating a position on the board of the solder including the solder group in design data or in production data;
generating ideal loading position information indicating an ideal loading position of the electronic component loaded on the solder group based on the ideal solder position information;
generating actual solder position information indicating a position of solder included in the solder group based on the image data of the solder irradiated by the light and for generation of loading estimate position information indicating a loading estimate position of the electronic component loaded on the solder group based on the actual solder position information;
generating ideal solder inspection standard information indicating a standard inspection position and/or standard inspection range of the solder included in the solder group based on design data or production data or the ideal solder position information;
wherein the categories and parameters of the loading estimate position information are the same as the categories and parameters of the ideal loading position information;
mounting position adjustment information is found based on positional shift amount and positional shift direction of the loading estimate position information relative to the ideal loading position information, and each solder included in the solder group is inspected using an actual inspection standard information obtained by shifting the ideal solder inspection standard information by just the amount of the mounting position adjustment information; and
the mounting position adjustment information is outputted to the component mounting apparatus.

20. The computer program product according to claim 19,
wherein the ideal solder inspection standard information and the actual inspection standard information are inspection window information relating to inspection windows, and
the operations further comprising:
extracting an actual solder region indicating a solder region occupied on the board by the solder included in the solder group based on the image data; and
inspecting each solder included in the solder group based on shift amount of the actual solder region relative to the inspection window information of the actual inspection standard information.

* * * * *